(12) United States Patent
Ravkin

(10) Patent No.: US 6,624,078 B1
(45) Date of Patent: Sep. 23, 2003

(54) METHODS FOR ANALYZING THE EFFECTIVENESS OF WAFER BACKSIDE CLEANING

(75) Inventor: Michael Ravkin, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/196,849

(22) Filed: Jul. 15, 2002

Related U.S. Application Data

(60) Provisional application No. 60/305,373, filed on Jul. 13, 2001.

(51) Int. Cl.[7] ............................................. H01L 21/461
(52) U.S. Cl. ...................... 438/692; 438/749; 438/758; 438/767; 134/1.3; 134/2; 134/3; 134/4
(58) Field of Search ................................. 438/692, 749, 438/758, 767

(56) References Cited

U.S. PATENT DOCUMENTS 5,601,656 A * 2/1997 Li ................................. 134/2

2002/0142617 A1 * 10/2002 Stanton ....................... 438/749

* cited by examiner

*Primary Examiner*—D Le
(74) *Attorney, Agent, or Firm*—Martine & Penilla, LLP

(57) ABSTRACT

A method for using a monitor substrate to determine effectiveness of a cleaning operation is provided. The method includes selecting a substrate from a lot of substrates and inspecting a surface of the substrate to determine a roughness profile of the substrate. The monitor substrate is then processed through a cleaning operation, and the monitor substrate is patterned with die regions throughout. Each of the die regions has a plurality of areas defining distinct roughness simulations. The method the proceeds to inspecting the monitor substrate at one die region and at one of the plurality of areas in the one die region that most closely resembles the roughness profile of the substrate. The inspecting of the monitor substrate is configured to yield data regarding cleaning performance of the cleaning operation.

27 Claims, 7 Drawing Sheets

W (Pitch in microns) = 0.1 - 1.0

P (Pattern density) = active width (Aw) / trench width (tw)=V

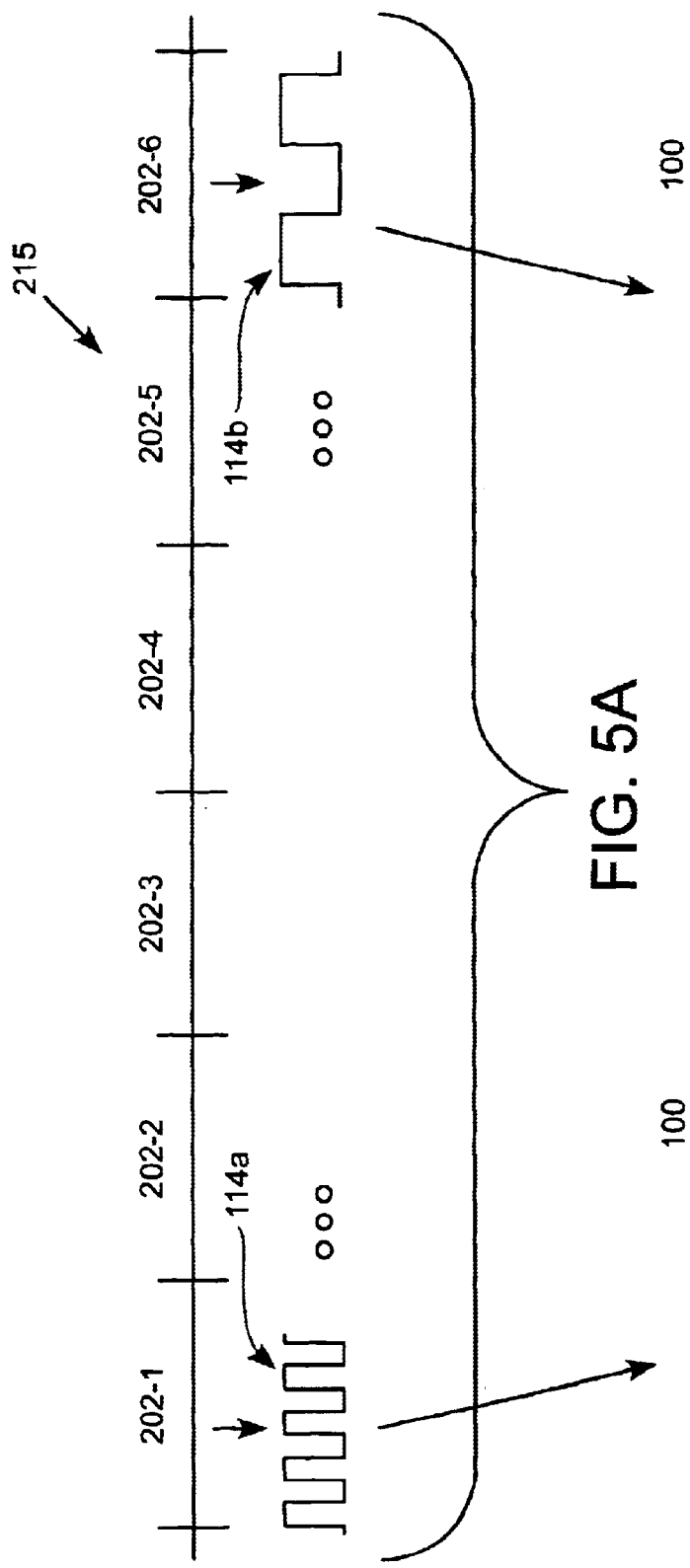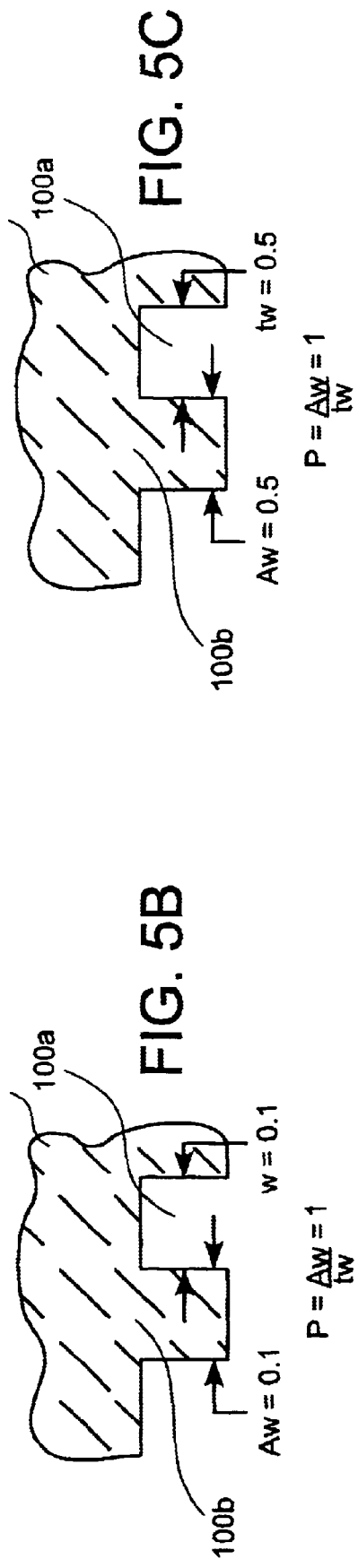
FIG. 5A
FIG. 5B
FIG. 5C

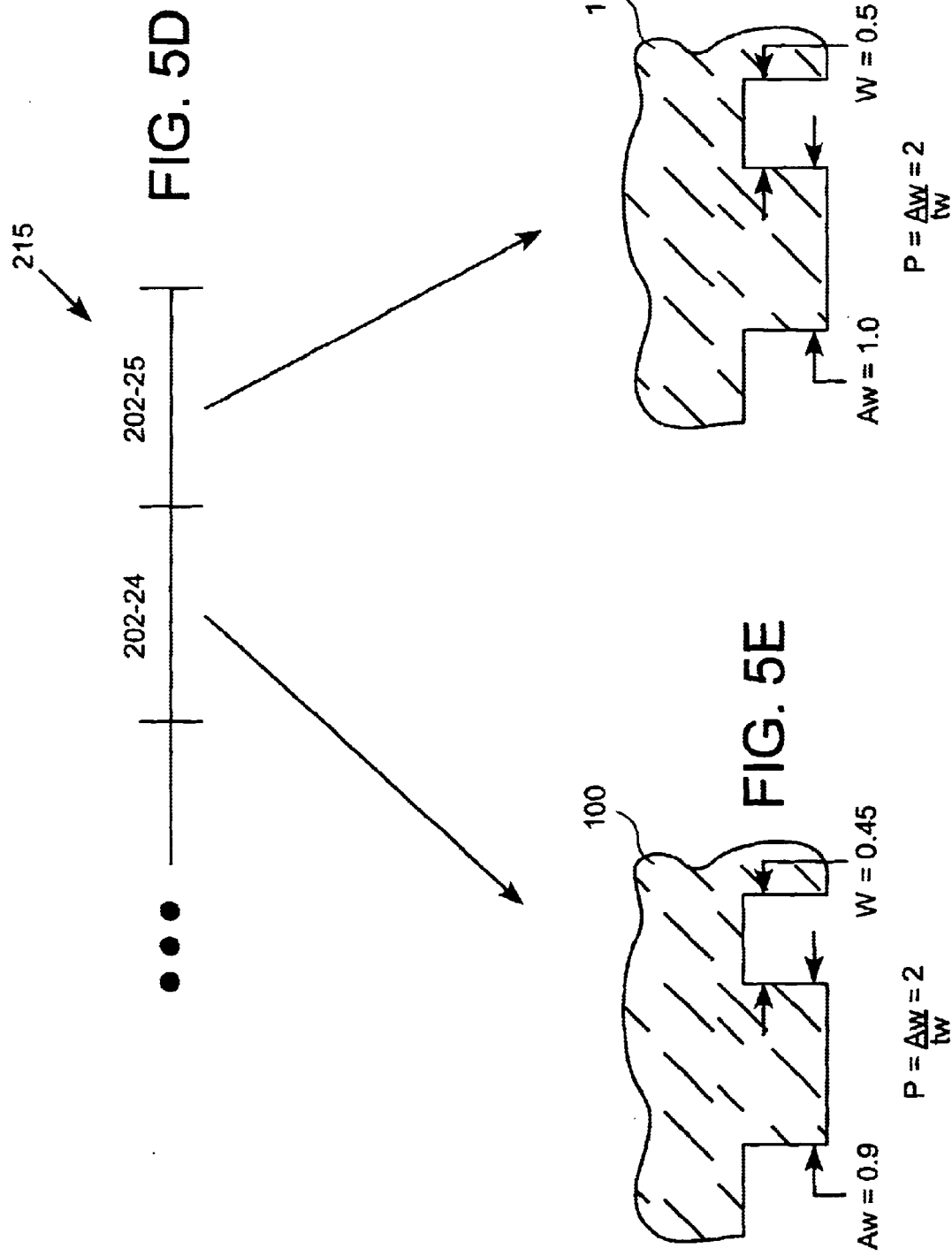

METHODS FOR ANALYZING THE EFFECTIVENESS OF WAFER BACKSIDE CLEANING

CROSS REFERENCE TO RELATED APPLICATIONS

This application claims priority from U.S. Provisional Patent Application No. 60/305,373, filed Jul. 13, 2001, and entitled "METHODS FOR ANALYZING THE EFFECTIVENESS OF WAFER BACKSIDE CLEANING." The disclosure of this application is incorporated herein by reference.

BACKGROUND OF THE INVENTION

1. Field of the Invention

The present invention relates generally to methods of making wafers for analytically inspecting the effectiveness of wafer backside cleaning, and methods for using such wafers to test and analyze the effectiveness of the cleaning operation(s).

2. Description of the Related Art

In the fabrication of semiconductor devices, there is a need to perform wet cleaning of substrates at various stages of the fabrication process. Typically, integrated circuit devices are in the form of multi-level structures. At the substrate level, transistor devices having diffusion regions are formed over and into silicon substrates. In subsequent levels, interconnect metallization lines are patterned and electrically connected to the transistor devices to define the desired functional device. As is well known, patterned conductive layers are insulated from other conductive layers by dielectric materials, such as silicon dioxide. At each metallization level there is a need to planarize metal or associated dielectric material. Without planarization, fabrication of additional metallization layers becomes substantially more difficult due to the higher variations in the surface topography. In some applications, metallization line patterns are formed in the dielectric material, and then metal CMP operations are performed to remove excess metallization.

Following each CMP operation, a wet clean of the substrate is performed. The wet clean is designed to wash away any by-products of the fabrication process, remove contaminants, and to achieve and maintain the necessary degree of cleanliness essential to proceed to a subsequent fabrication operation. As transistor device structures become smaller and more complex, the precision required to achieve and maintain structure definition demands exacting standards of cleanliness be maintained in all process operations. If a wet clean is incomplete or ineffective, or if a post-wet clean drying is incomplete or ineffective, then unacceptable residue or contaminants are introduced into the processing environment.

Rinsing and drying techniques, methods, and apparatus are plentiful and known in the art, and incorporate such operations as rinsing and scrubbing, immersion, and the application of thermal, mechanical, chemical, electrical, or sonic energy and the like to remove or displace water and dry the substrate. While some scrub and rinse operations may employ acids or bases for vigorous interaction with fabrication by-products, deionized water (DIW) is commonly used to perform a final rinse before the desired drying technique is performed.

Once a substrate has been processed through a wet clean and dried, the wafer is allowed to stand and if any water remained after the drying process, it would evaporate. Water allowed to evaporate introduces contaminants as evidenced by the water marks or stains caused by residual solids from evaporated water. It is therefore desirable to evaluate drying techniques used, recognizing that the techniques are more or less effective depending on such factors as the type of substrate being processed, fabrication materials, processing environment, and the like. Common methods of evaluating the effectiveness of selected drying techniques include visual inspection, electrical analysis and mass analysis.

Visual inspection of substrates is generally effective for blanket film substrates as the surface of the substrate is smooth and easily inspected for remaining water. Patterned substrates, however, are difficult to inspect visually as water can be trapped in patterned features and not visible. The backside of a wafer will also have a level of roughness. This roughness can, in some cases, define features up to 5000 angstroms RMS (root mean squared) or more. For comparison, the roughness of a polished wafer or surface may only yield feature sizes up to about 1–20 angstroms RMS (root mean squared). Visual inspection is therefore ineffective for drying technique evaluation.

Electrical analysis can also be effective for blanket film substrates, but as more and more structures are fabricated and regions of the substrate subjected to doping, and masking, electrical analysis can be detrimental to transistor structure fabrication as electrical charges introduced can damage or destroy precisely charged regions of the structures being fabricated.

Mass analysis is a comparative evaluation of wet and dry substrates. Typically, mass analysis includes an initial drying operation followed by weighing the substrate and then, after some time, re-weighing the substrate to determine if a change in mass has or has not occurred. Although mass analysis is not subject to the same limitations presented by visual inspection and electrical analysis in the evaluation of patterned substrates, mass analysis is cumbersome, time consuming, and far less accurate than other methods.

What is needed is a method to evaluate advanced cleaning and drying techniques used in the fabrication of semiconductor substrates. The method should include a way to accurately and precisely analyze a substrate that has been dried, and to use the results of the analysis to select, modify, or adjust the cleaning and/or drying technique to ensure that the backside of wafers used to make active integrated circuit chips do not introduce contaminants into the processing environment.

SUMMARY OF THE INVENTION

Broadly speaking, an invention for is provided for analytically analyzing the effectiveness of semiconductor wafer cleaning operations. It should be appreciated that the present invention can be implemented in numerous ways, including as a process, an apparatus, a system, a device, or a method. Several inventive embodiments of the present invention are described below.

In one embodiment, a method for using a monitor substrate to determine effectiveness of a cleaning operation is disclosed. The method includes selecting a substrate from a lot of substrates and inspecting a surface of the substrate to determine a roughness profile of the substrate. The monitor substrate is then processed through a cleaning operation, and the monitor substrate is patterned with die regions throughout. Each of the die regions has a plurality of areas defining distinct roughness simulations. The method the proceeds to inspecting the monitor substrate at one die region and at one of the plurality of areas in the one die region that most closely resembles the roughness profile of the substrate. The inspecting of the monitor substrate is configured to yield data regarding cleaning performance of the cleaning operation.

In another embodiment, a process for determining effectiveness of a substrate cleaning operation is disclosed. The method includes selecting a substrate from a lot of substrates and inspecting a surface of the substrate selected from the lot of substrates to determine a roughness profile of the substrate. The method then includes processing a monitor substrate through a cleaning operation. The monitor substrate is patterned with die regions throughout, and each of the die regions has a plurality of areas defining distinct roughness simulations. Each die region further having pitches ranging between about 0.1 micron and about 1 micron and pattern densities ranging between about 1 and 2. The monitor substrate is inspected after completing the processing. The inspecting occurring at one die region and at one of the plurality of areas in the one die region that most closely resembles the roughness profile of the substrate. The inspecting of the monitor substrate yielding data quantifying cleaning performance of the cleaning operation.

In yet another embodiment, a method for making a monitor substrate for determining cleaning performance of a cleaning process is disclosed. The method includes designing a pattern that includes a matrix of different roughness simulations, the pattern defining a die region. Each of the different roughness simulations having a pitch ranging between about 0.1 micron and about 1 micron and a pattern density ranging between about 1 and 2. The method further includes replicating the die region over a surface of the monitor substrate. The replicating of the die region over the surface is designed to cover substantially all of the surface of the monitor wafer. The monitor wafer is capable of being processed through cleaning operations and inspected at particular die regions in particular roughness simulations to ascertain performance of the cleaning operations.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

FIG. 5A–5F illustrate a differing simulated roughness profile geometries, in accordance with embodiments of the invention.

DETAILED DESCRIPTION OF EXEMPLARY EMBODIMENTS

An invention for analytically analyzing the effectiveness of a cleaning operation or operations is disclosed. To analyze the effectiveness, a monitor wafer is fabricated. The monitor wafer is made using a design pattern (e.g., reticle mask), which has a plurality of simulated roughness profiles. Each of the roughness profiles is designed to simulate what the roughness might be on the backside of a wafer that will actually be used for fabricating semiconductor integrated circuit chips. As such, once the monitor wafer is made, different cleaning operations can be tested on the monitor wafer, and then by analyzing different regions on the monitor wafer, it can be determined whether the particular cleaning process will actually serve to clean the backside of the wafer to the desired degree, since the backside of any wafer will naturally have a roughness profile. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
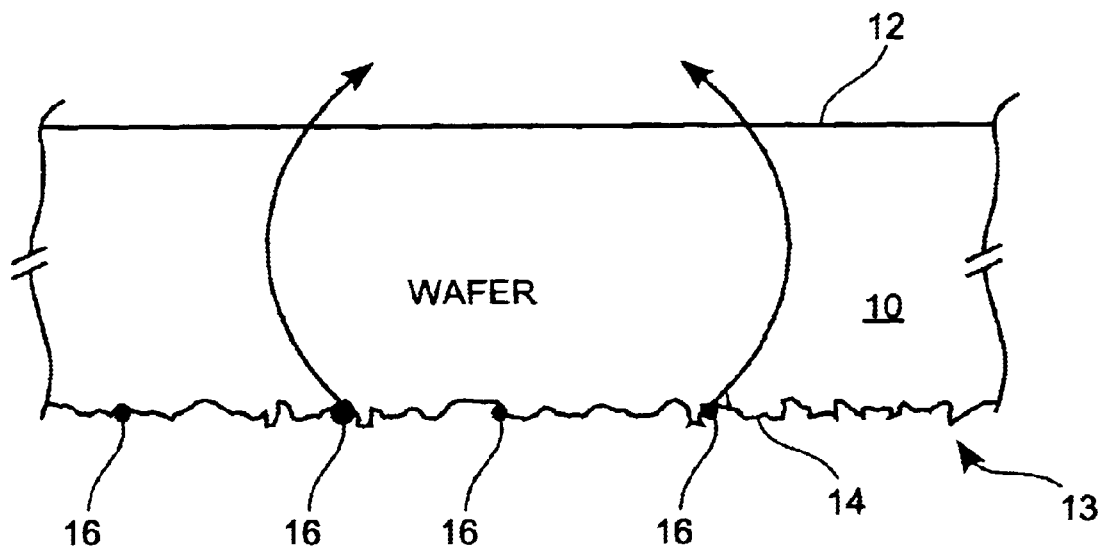
FIG. 1 shows a wafer having a roughness profile and particulates lodged in the feature topography thereof.

FIG. 1 shows a cross-sectional view of a semiconductor wafer 10 having a backside 13 and a top surface 12. The top surface 12, in one embodiment, has been processed so as to create a smoother surface relative to the backside 13. The backside 13, since it is not put through manufacturing steps such as polishing operations, will exhibit a roughness profile 14. The roughness profile 14, when examined by a surface profiling apparatus, will exhibit a rough surface topography. Example surface profiling equipment can be obtained from KLA-Tencor, Inc., of Milpitas, Calif. Examples of surface profiling equipment, also known as, surface profileometers, include the Alpha Step 500 Surface Profiler, the Tencor P-10 Surface Profiler, the Tencor P-11 Long Scan Profiler, the Tencor HRP-75 and HRP-100 High-Resolution Profilers, and others. Accordingly, the rough surface topography on the backside 13 of the semiconductor wafer 10 will then provide a source of regions in which contaminants/particulates may be lodged during the fabrication (or when transported around a clean room) of the top surface of the semiconductor wafer 10.

For simplicity, the top surface 12 of the semiconductor wafer 10 is shown as a substantially smooth surface. Of course, it should be understood that a number of active device transistors will be formed in the semiconductor wafer 10 and then a number of fabrication steps are performed to form the interconnect structures used to define an integrated circuit chip from the semiconductor wafer 10. For purposes of this discussion, emphasis will be placed on the backside 13 of the semiconductor wafer 10, and its roughness profile 14 that is susceptible to trapping contaminants 16. As can be appreciated, the contaminant 16, during the fabrication operations, may dislodge and inadvertently deposit themselves on the top surface 12.

When contaminants and other particles are deposited or attached to the top surface 12 during fabrication, those contaminants can cause performance failures to the various integrated circuits and features being fabricated thereon. For this reason, it is important to take into consideration the roughness profile of a semiconductor wafer 10 being processed so that appropriate cleaning techniques can be used to dislodge any contaminants or particles that may be susceptible to collection in the given roughness profile 14.

As semiconductor wafers 12 are made, the backside 13 of different semiconductors wafers 10 will exhibit different roughness profiles 14. Some lots of wafers 10 will exhibit more dense roughness profiles while others will exhibit less of a rough profile. For this reason, it is necessary to determine the approximate roughness profile of a semiconductor wafer to determine whether contaminants are being adequately cleaned during processing. The following discussion will therefore define a technique for generating a monitor wafer which has a plurality of roughness profiles that can be processed through a cleaning operation and then analytically inspected to determine whether the cleaning operations are adequate for the roughness profile of a to-be-processed semiconductor wafer.

Accordingly, the discussion will first present a method for making a monitor wafer, and then a method for using the monitor wafer to analytically inspect whether the cleaning/drying operations are being adequately performed for semiconductor wafers that will ultimately be formed into functioning integrated circuit devices.

Figure 2:
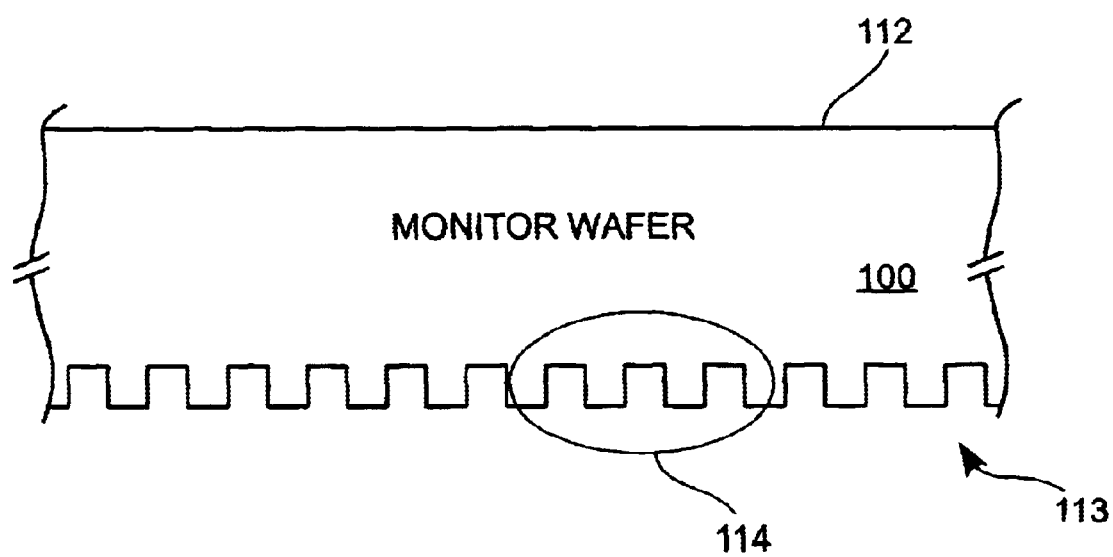
FIG. 2 shows a sample monitor wafer, wherein a simulated roughness profile has been fabricated on one side of the monitor wafer.

With this in mind, FIG. 2 illustrates a cross-sectional view of a monitor wafer 100 having a wafer top surface 112 and a backside 113. The backside 113 is fabricated with a roughness profile 114. The roughness profile 114 is fabricated using standard photolithography and etching techniques. The roughness profile 114 is designed to simulate the approximate roughness profile of a wafer that is to be used for fabricating integrated circuit devices. By way of example, the roughness profile 14 of a semiconductor wafer 10 might have particular topographic features that may be as large as 5,000 Å RMS (root mean squared) in size.

Of course, these particular sizes can be determined using the aforementioned surface profiling apparatus or other know techniques. Knowing that topographic features on the backside 13 of a semiconductor wafer 10 can be as large as 5,000 Å RMS will allow the fabrication of roughness profiles 114 on a monitor wafer to simulate the topographic features on the backside of a true semiconductor wafer 10. Using the monitor wafer 100, it is then possible to move the monitor wafer 100 through a wafer cleaning operation and then subsequently inspect the roughness profile 114 to determine whether the particles and contaminants have been adequately cleaned from the monitor wafer 100 roughness profile 114. If cleaning is shown to be adequate enough for the application, then an assumption can be made that the semiconductor wafer 10 of FIG. 1 (and many more if fabricated in lots) will also be adequately cleaned during normal cleaning operations, which are repeated for each wafer.

If it is determined that the roughness profile 114 is not being adequately cleaned when exposed to the cleaning processes, then the cleaning operation will be adjusted so as to achieve appropriate cleaning of a semiconductor 10 during normal processing. Advantageously, it will no longer be necessary to subject wafers 10 that are being processed through delicate semiconductor processing operations to separate examination operations to determine whether the backside of the wafer is adequately being cleaned. In addition, by insuring that the backside of a semiconductor wafer 10 is being adequately cleaned, additional assurance can be had that the contaminants 16 will not inadvertently migrate to the top surface 12 of the semiconductor wafer being processed.

Figure 3:
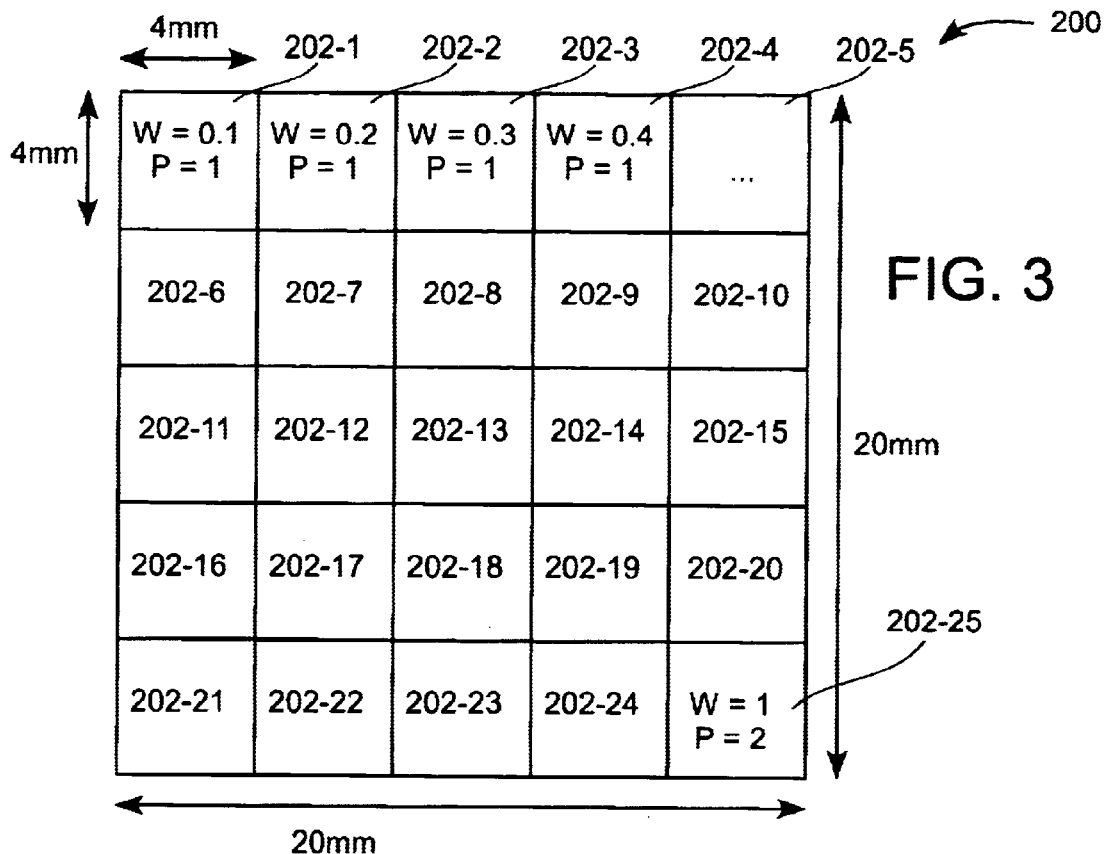
FIG. 3 illustrates a sample design pattern having a plurality of simulated roughness profile regions, in accordance with embodiments of the invention.

FIG. 3 illustrates a design pattern 200 divided into a plurality of simulated roughness profile regions 202. In this exemplary embodiment, the design pattern is approximately 20 mm by 20 mm in size. The size may of course be modified to any size. Accordingly, each of the simulated roughness profile regions 202 will be approximately about 4 mm by about 4 mm in size. Each of the simulated roughness profile regions 202 will have an associated active width (Aw) and trench width (tw). As illustrated, the trench width tw is also defined as the pitch of the simulated roughness profile regions 202. P defines pattern density which is equivalent to the active width divided by the trench width. In this example, the pitch (tw) will range between 0.1 micron and about 1 micron. The pattern density P will range between 1 and 2. These ranges, again, may vary. With these definitions in mind, each of the simulated roughness profile regions 202 will have a varying pitch (W).

For instance, simulated roughness profile region 202-1 will have a pitch of 0.1 micron and a pattern density of 1.0. Simulated roughness profile region 202-2 will have a pitch of 0.2 micron and a pattern density of 1.0. Simulated roughness profile region 202-3 will have a pitch of 0.3 micron and a pattern density of 1.0. Simulated roughness profile region 202-4 will have a pitch of 0.4 micron and a pattern density of 1, and so on, up to simulated roughness profile region 202-25 in which the pitch equals 1.0 and the pattern density is 2.0. In general, the design pattern 200 is made with the intent to vary the roughness profiles in each one of the simulated roughness profile regions 202. In this manner, when the design pattern 200 is transferred to a reticle and then to the monitor wafer 100, it is possible to test the monitor wafer 100 at different locations on the wafer as well as different roughness profile regions at those different locations.

Figure 4:
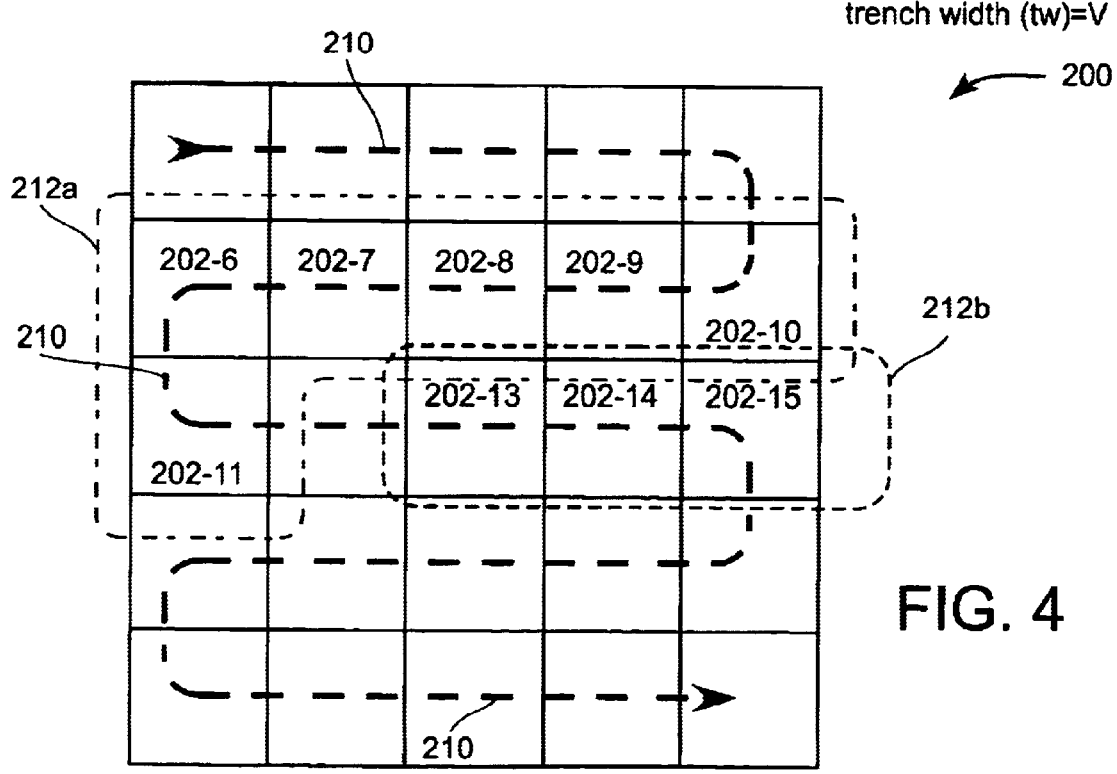
FIG. 4 illustrates a method for selecting certain ones of the roughness profile regions to inspect for cleaning effectiveness, in accordance with embodiments of the invention.

In addition, different wafers will have different ranges of roughness profiles when examined using a surface profiling apparatus. If after examination of a lot of wafers or a set of wafers, it is determined that the surface profile lies between a range of simulated profile roughness regions, then it will only be necessary to examine those roughness profile regions of the design pattern 200, after a test clean operation is made of the monitor wafer 100. For example, FIG. 4 illustrates a number of techniques for inspecting the design pattern after it has been placed on a monitor wafer and processed through a cleaning operation.

To determine if the cleaning operation was adequate for a particular roughness profile or a number of roughness profile regions, the monitor wafer once processed through the cleaning operations can be examined at different locations throughout the semiconductor wafer itself. In addition to testing at different locations on the semiconductor wafer, it may only be necessary to test the simulated roughness profile regions of the design pattern 200 for a subset of the simulated roughness profile regions 202. This is shown by identifying a first set of simulated roughness profile regions 212a which include simulated roughness profile regions 202-6, 202-7, 202-8, 202-9, 202-10, and 202-11.

Figure 6:
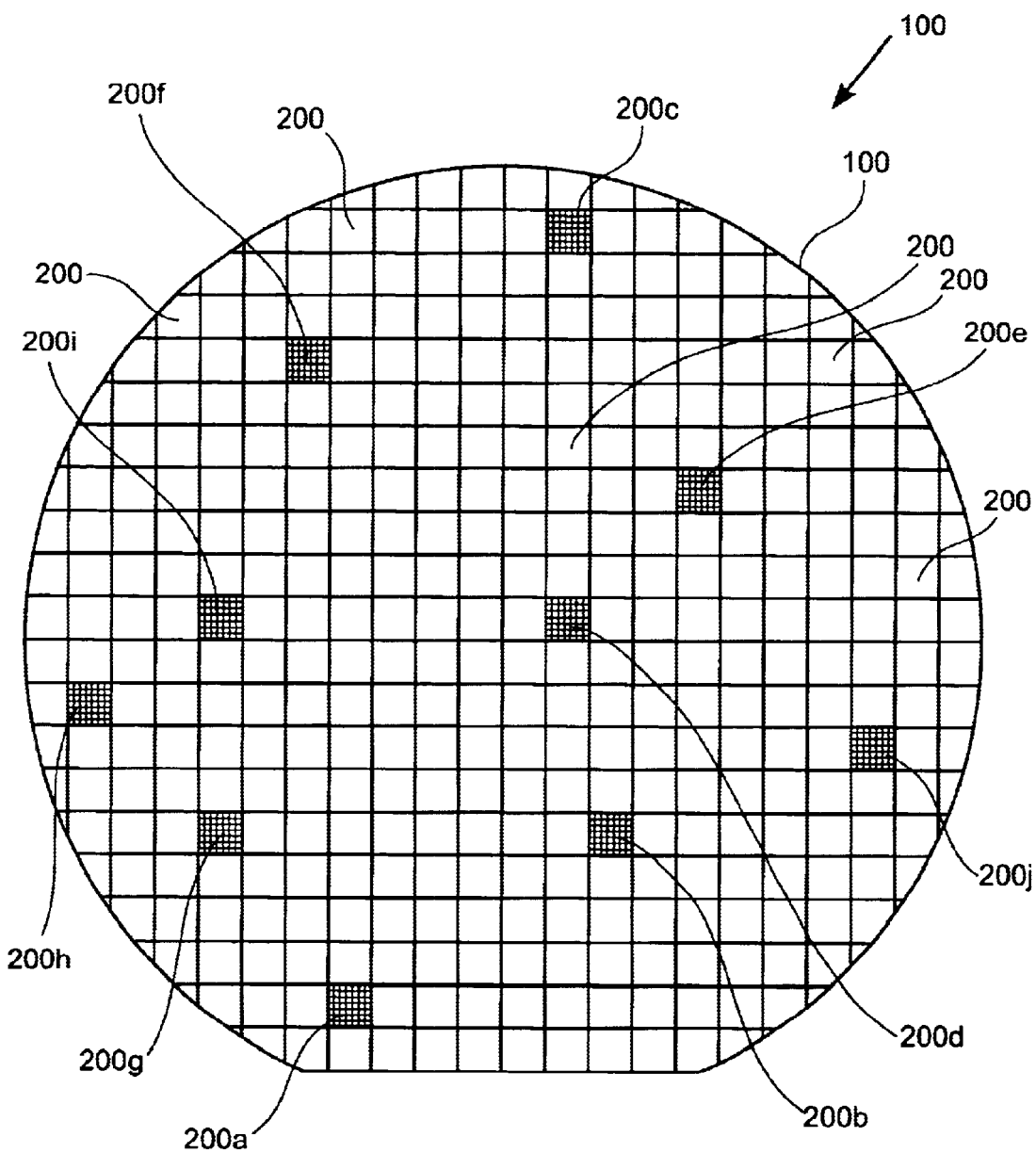
FIG. 6 illustrates a sample monitor wafer and selected design patterns selected for inspection, to enable verification that substantially the same cleaning is occurring throughout the wafer surface, in accordance with embodiments of the invention.

Thus, when the monitor wafer 100 is examined at its different locations (i.e., different design patterns 200 on the semiconductor wafer as shown in FIG. 6), special attention will only be devoted to those simulated roughness profile regions that are part of the first set of simulated profile roughness regions 212a. Of course, if the set of wafers being processed have a different roughness profile, it will only be necessary to test a second set of simulated roughness profile regions 212b, since those profile regions most closely exhibit the true roughness on the semiconductor wafers to be processed into integrated circuit chips. In still another embodiment, it may be desirable to test each one of the simulated roughness profile regions 202 of the entire design pattern 200 to determine what the cleaning effectiveness is for a particular cleaning operation to be performed on a number of semiconductor wafers.

In such a case, the inspection of each of the simulated roughness profile regions 202 may be performed as a raster scan inspection as illustrated by 210. That is, simulated roughness profile region 202-1 will be inspected first, and then simulated roughness profile region 202-25 will be inspected last following the path illustrated by 210. In still another embodiment, it may only be necessary to examine a single one of the simulated roughness profile regions 202 of the design pattern 200. This may be the case where the true semiconductor wafer backsides will have a very well known or established roughness profile that fits closely to only one of the simulated roughness profile regions 202.

FIG. 5A illustrates a bar graph 215 in which the different simulated roughness profile regions have been magnified to show how the simulated roughness profiles will change for each one of the simulated roughness profile regions 202. In one example, simulated roughness profile region 202-1 is shown as a roughness profile 114a which has a dense roughness profile relative to the less dense roughness profile of the simulated roughness profile region 202-6 which is shown as 114b. FIG. 5B illustrates that the simulated roughness profile region will have a plurality of trench features 100a and a plurality of active features 100b. In this example, the trench width is 0.1 micron and the active feature is 0.1 micron.

Therefore, the pattern density P is equal to the active feature (Aw) divided by the trench feature (tw), which equals 1. FIG. 5C illustrates the exemplary feature geometries for simulated roughness profile region 202-6. FIG. 5D illustrates the continuation of the bar graph 215 in which simulated roughness profile regions 202-24 and 202-25 are illustrated each in FIG. 5E and FIG. 5F, respectively. FIG. 5E illustrates a roughness profile in which the active width (Aw) is about 0.9 micron and the trench width (tw) is equal to about 0.45 micron. In this scenario, the pattern density P is equal to 2. The simulated roughness profile region 202-25 is also set to have a pattern density P equal to 2, but the active width is set to one micron and the trench width is set to 0.5 micron. Of course, more variations of P, tw and Aw can be made to make additional variations in pattern densities.

As can be appreciated, each of the simulated roughness profile regions 202 will therefore range in pattern density so that a number of different pattern densities can be contained within a single design pattern 200. As mentioned earlier, FIG. 6 illustrates a monitor wafer in which the design pattern 200 has been formed on the monitor wafer 100 throughout its entire surface. In use, the monitor wafer is processed through a cleaning operation and then examined at particular regions and locations throughout the monitor wafer. These different locations may be signified by exemplary locations of the design patterns 200a through 200j. As can be seen, by inspecting different locations throughout the monitor wafer 100 and also concentrating on the particular set of simulated roughness profile regions 212 of each of the design patterns 200, it is possible to determine whether the cleaning operation being used will be sufficient to dislodge or clean all contaminants and particles that may cause defects during the fabrication process of an actual wafer to be processed into IC chips.

Figure 7:
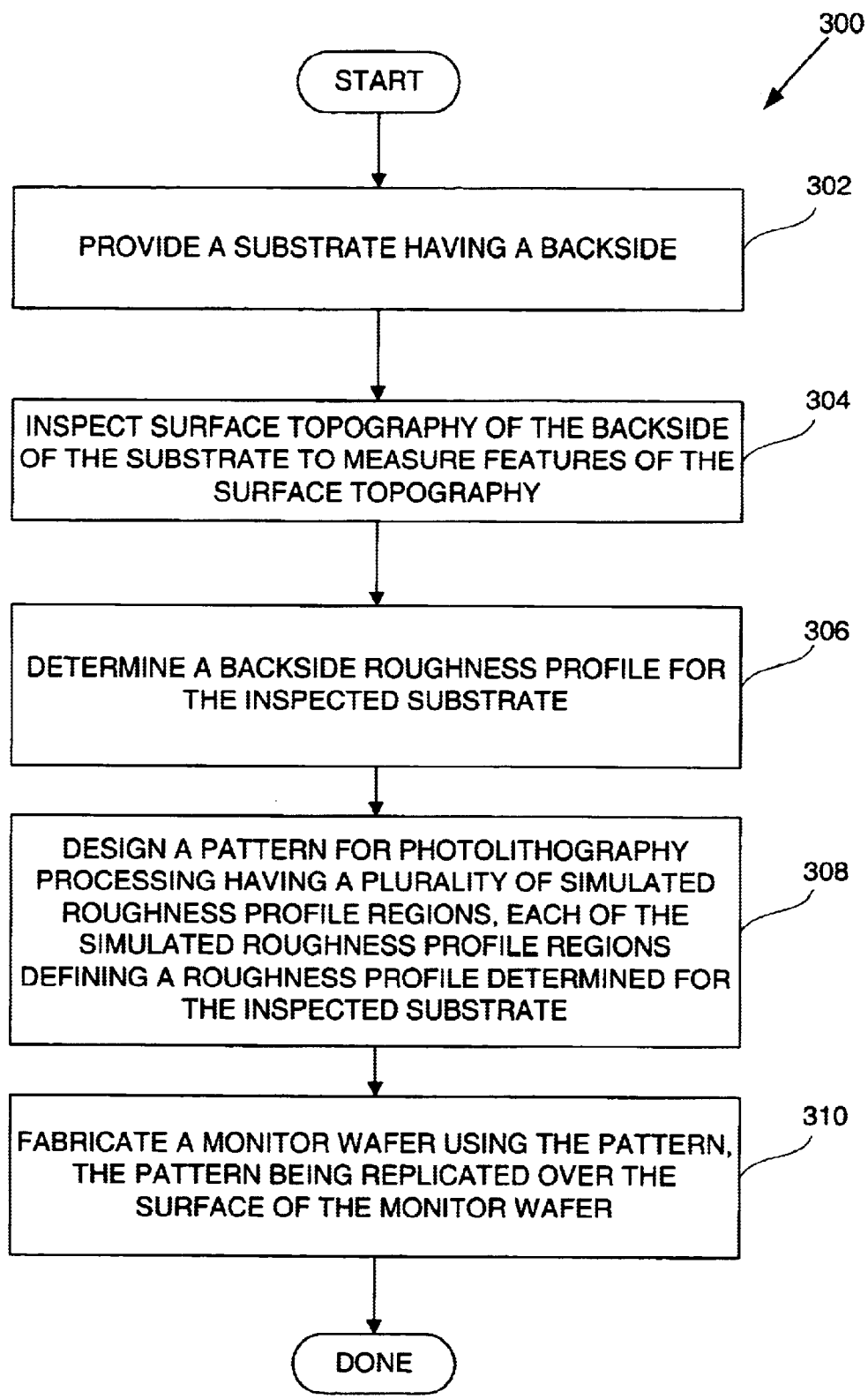
FIG. 7 illustrates a method flowchart for the exemplary method operations used to make a monitor wafer, in accordance with embodiments of the invention.

FIG. 7 illustrates a flowchart diagram 300 in which a monitor wafer is made, in accordance with one embodiment of the present invention. The method begins at operation 302 where a substrate having a backside is provided. The substrate is then inspected for surface topography using a surface profiler that measures features of the surface topography in operation 304. Once the surface topography features have been measured using the profiler in operation 304, the method moves to operation 306 where a backside roughness profile for the inspected substrate is determined. The determined backside roughness profile may be close to or substantially equivalent to one of the various simulated roughness profile regions discussed above. The method now moves to operation 308 where a pattern for photolithography processing is designed. The pattern is analogous the pattern used to form the design pattern 200 of FIG. 3.

The pattern preferably has a plurality of simulated roughness profile regions, and each of the simulated profile regions define a roughness profile that includes the roughness profile determined for the inspected substrate. By way of example, if the determined backside roughness profile determined in operation 306 yields an approximate roughness profile equivalent to, for example, the simulated roughness profile region 202-13, the design pattern 200 will be made such that there will be roughness profile regions with more dense and less dense features throughout the design pattern 200. Thus, the exemplary design pattern 200 of FIG. 3 would be representative of a design pattern formed having a range of pattern densities which are greater than and less than the sample wafer inspected in operation 304 of this method. The method now moves to operation 310 where a monitor wafer is fabricated using the pattern defined with the plurality of simulated roughness profile regions.

The pattern is then replicated over the surface of the monitor wafer using standard photolithography processes that utilize a stepper to cover the entire surface of the monitor wafer. Once the design pattern has been exposed over the monitor wafer, which previously had a photoresist layer formed thereon, the photoresist is developed and then the monitor wafer is placed through an etching operation to form the different sized roughness profile regions throughout each of the design patterns 200 as shown in FIG. 6. At this point, the monitor wafer 100 will be ready for use. In use, the monitor wafer is processed through a cleaning operation or a number of cleaning operations to determine when the cleaning operation in questions has, in fact, cleaned the wafer in those particular simulated roughness profile regions there analogous to or equivalent to, the roughness of a semiconductor wafer to be processed into integrated circuit chips.

Figure 8:
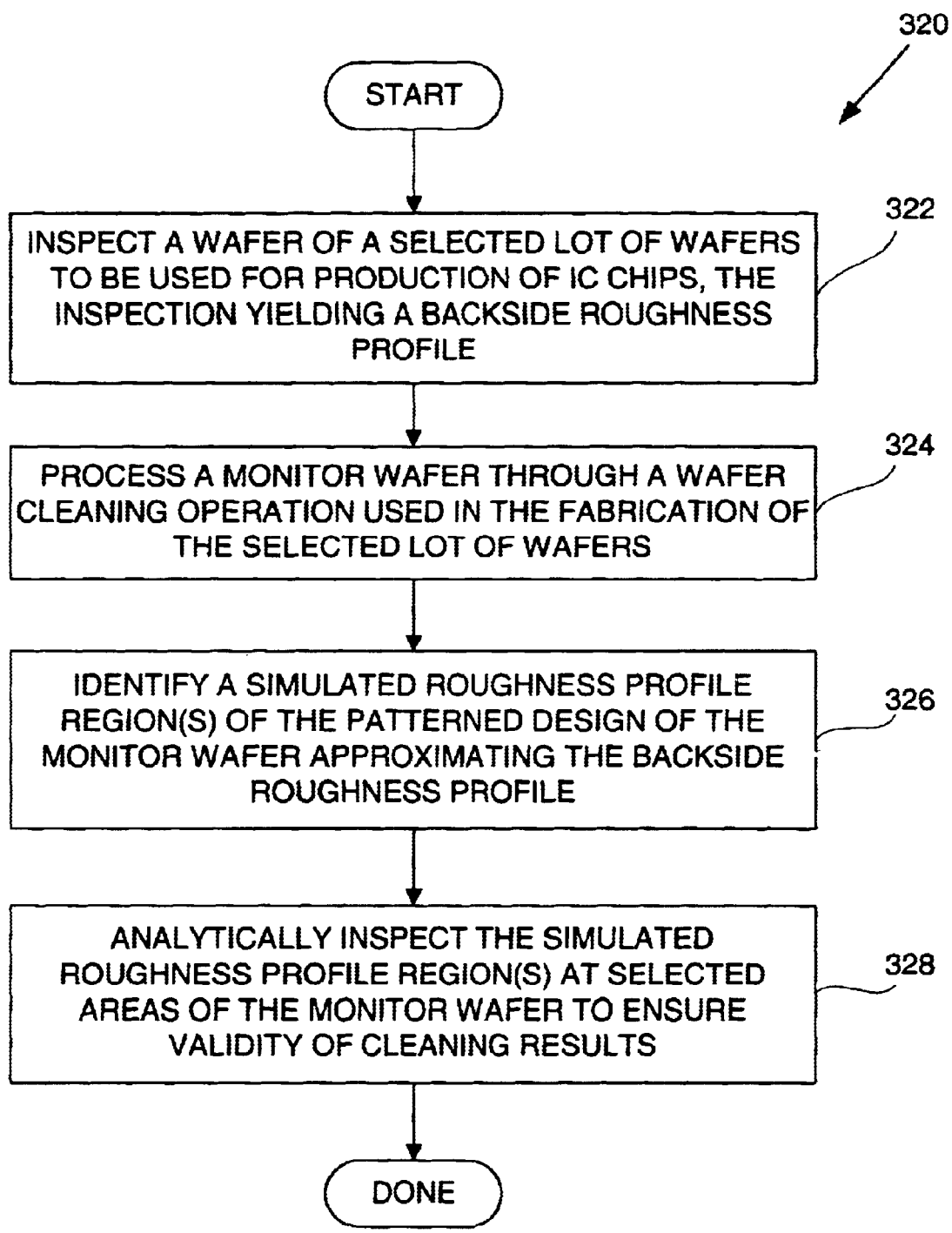
FIG. 8 illustrates a sample method flowchart of the methods operations used to implement the monitor wafer in practice, in accordance with embodiments of the invention.

FIG. 8 illustrates the use of the monitor wafer in accordance with one embodiment of the present invention. The method 320 begins at operation 322 where a wafer of a selected lot of wafers to be used for production of IC chips is inspected. The inspection will yield a backside roughness profile. The yielded backside roughness profile will then be matched up to at least one or more of the simulated roughness profile regions 202 of the design pattern 200. For example, the inspected wafer might have yielded roughness profiles that are equivalent to those of the simulated roughness profile regions 202-13, 202-14, and 202-15 which define the second set of simulated roughness profile regions of FIG. 4.

Of course, it could include any number of the various simulated roughness profile regions 202 throughout the design pattern 200. The method then moves to operation 324 where a monitor wafer is processed through a wafer cleaning operation used in the fabrication of the selected lot of wafers. The cleaning operation may include any number of processes which commonly are employed to do wafer cleaning. Once the cleaning operation has been performed in operation 324, the method moves to operation 326. In operation 326, the simulated roughness profile region or regions are identified from the pattern design 200. These identified roughness profile regions will essentially match or substantially equivalently match the roughness profile for the actual semiconductor wafers to be used for making integrated circuit chips. Once these regions have been identified such as region 212*b* or region 212*a* or any number of the simulated roughness profile regions 202 of the pattern design, the method will move to operation 328.

In operation 328, analytical inspection is made of the simulated roughness profile region or regions on the monitor wafer. To ensure that cleaning is being performed adequately throughout the surface of the wafer, different design patterns 200 throughout the semiconductor wafer surface, the inspection is performed at various locations as illustrated in FIG. 6. At this point, it can be determined whether the cleaning operation or operations being performed are adequately cleaning particulates, contaminants, or particles from the simulated roughness profile. If it is determined that the cleaning operation is appropriately cleaning the selected simulated roughness profile regions, it will then be appropriate to proceed with normal processing of semiconductor wafers. This processing will be with assurance that the backside of the wafer will also be cleaned to the same or at least as well as the cleaning that was determined using the monitor wafer for the particular roughness that is also exhibited in the backside of a wafer being processed to make integrated circuit chips.

Although the foregoing invention has been described in some detail for purposes of clarity of understanding, it will be apparent that certain changes and modifications may be practiced within the scope of the described embodiments. Accordingly, the present embodiments are to be considered as illustrative and not restrictive, and the invention is not to be limited to the details given herein, but may be modified within the scope and equivalents of the claims.

What is claimed is:

1. A method for using a monitor substrate to determine effectiveness of a cleaning operation, comprising:

selecting a substrate from a lot of substrates;

inspecting a surface of the substrate to determine a roughness profile of the substrate;

processing a monitor substrate through a cleaning operation, the monitor substrate being patterned with die regions throughout, each of the die regions having a plurality of areas defining distinct roughness simulations; and inspecting the monitor substrate at one die region and at one of the plurality of areas in the one die region that most closely resembles the roughness profile of the substrate, the inspecting of the monitor substrate yielding data regarding cleaning performance of the cleaning operation.

2. A method for using a monitor substrate to determine effectiveness of a cleaning operation as recited in claim 1, further comprising:

repeating the inspecting of the monitor substrate at another die region, the inspecting of the other die region being used to validate the data regarding the cleaning performance.

3. A method for using a monitor substrate to determine effectiveness of a cleaning operation as recited in claim 1, further comprising:

repeating the inspecting of the monitor substrate at another die region that is apart from the die region first inspected.

4. A method for using a monitor substrate to determine effectiveness of a cleaning operation as recited in claim 3, wherein the other die region that is apart from the die region first inspected is near an edge of the substrate.

5. A method for using a monitor substrate to determine effectiveness of a cleaning operation as recited in claim 3, wherein the other die region that is apart from the die region first inspected is near a center of the substrate.

6. A method for using a monitor substrate to determine effectiveness of a cleaning operation as recited in claim 1, further comprising:

verifying the cleaning performance at a plurality of other die regions.

7. A method for using a monitor substrate to determine effectiveness of a cleaning operation as recited in claim 6, further comprising:

adjusting the cleaning operation in response to the analysis of the data regarding cleaning performance obtained from the verification of the cleaning performance.

8. A method for using a monitor substrate to determine effectiveness of a cleaning operation as recited in claim 7, further comprising:

running the adjusted cleaning operation on the lot of substrates.

9. A method for using a monitor substrate to determine effectiveness of a cleaning operation as recited in claim 1, wherein the cleaning operation includes dual-sided brush scrubbing and an application of cleaning fluids.

10. A method for using a monitor substrate to determine effectiveness of a cleaning operation as recited in claim 9, wherein the cleaning operation further includes spin rinsing and drying.

11. A method for using a monitor substrate to determine effectiveness of a cleaning operation as recited in claim 1, wherein the each of the distinct roughness simulations has a different pitch ranging between about 0.1 micron and about 1 micron.

12. A method for using a monitor substrate to determine effectiveness of a cleaning operation as recited in claim 1, wherein a pattern density for each of the distinct roughness simulations ranges between about 1 and about 2.

13. A process for determining effectiveness of a substrate cleaning operation, comprising:

selecting a substrate from a lot of substrates;

inspecting a surface of the substrate selected from the lot of substrates to determine a roughness profile of the substrate;

processing a monitor substrate through a cleaning operation, the monitor substrate being patterned with die regions throughout, each of the die regions having a plurality of areas defining distinct roughness simulations, each having a pitch ranging between about 0.1 micron and about 1 micron and a pattern density ranging between about 1 and 2; and inspecting the monitor substrate after completing the processing, the inspecting occurring at one die region and at one of the plurality of areas in the one die region that most closely resembles the roughness profile of the substrate, the inspecting of the monitor substrate yielding data quantifying cleaning performance of the cleaning operation.

14. A process for determining effectiveness of a substrate cleaning operation as recited in claim 13, further comprising:
repeating the inspecting of the monitor substrate at another die region, the inspecting of the other die region being used to validate the data regarding the cleaning performance.

15. A process for determining effectiveness of a substrate cleaning operation as recited in claim 13, further comprising:
repeating the inspecting of the monitor substrate at another die region that is apart from the die region first inspected.

16. A process for determining effectiveness of a substrate cleaning operation as recited in claim 15, wherein the other die region that is apart from the die region first inspected is near an edge of the substrate.

17. A process for determining effectiveness of a substrate cleaning operation as recited in claim 15, wherein the other die region that is apart from the die region first inspected is near a center of the substrate.

18. A process for determining effectiveness of a substrate cleaning operation as recited in claim 13, further comprising:
verifying the cleaning performance at a plurality of other die regions.

19. A process for determining effectiveness of a substrate cleaning operation as recited in claim 18, further comprising:
adjusting the cleaning operation in response to the analysis of the data regarding cleaning performance obtained from the verification of the cleaning performance.

20. A process for determining effectiveness of a substrate cleaning operation as recited in claim 19, further comprising:
running the adjusted cleaning operation on the lot of substrates.

21. A process for determining effectiveness of a substrate cleaning operation as recited in claim 13, wherein the cleaning operation includes dual-sided brush scrubbing and an application of cleaning fluids.

22. A method for making a monitor substrate for determining cleaning performance of a cleaning process, comprising:
designing a pattern that includes a matrix of different roughness simulations, the pattern defining a die region, each of the different roughness simulations having a pitch ranging between about 0.1 micron and about 1 micron and a pattern density ranging between about 1 and 2; and
replicating the die region over a surface of the monitor substrate, the replicating of the die region over the surface being designed to cover substantially all of the surface of the monitor wafer;
wherein the monitor wafer is capable of being processed through cleaning operations and inspected particular at die regions in particular roughness simulations to ascertain performance of the cleaning operations.

23. A method for making a monitor substrate for determining cleaning performance of a cleaning process as recited in claim 22, wherein the monitor wafer is designed to be inspected at die regions to validate the performance of the cleaning operations.

24. A method for making a monitor substrate for determining cleaning performance of a cleaning process as recited in claim 22, further comprising:
defining the matrix of different roughness simulations within a pattern size of 20 mm by 20 mm.

25. A method for making a monitor substrate for determining cleaning performance of a cleaning process as recited in claim 24, wherein each of the different roughness simulations have a size of about 4 mm by 4 mm.

26. A method for making a monitor substrate for determining cleaning performance of a cleaning process as recited in claim 22, wherein the monitor substrate is a semiconductor wafer.

27. A method for making a monitor substrate for determining cleaning performance of a cleaning process as recited in claim 22, wherein the cleaning process includes brush scrubbing, rinsing and drying.

* * * * *